US008841058B2

(12) United States Patent
Chang

(10) Patent No.: US 8,841,058 B2
(45) Date of Patent: Sep. 23, 2014

(54) PHOTOLITHOGRAPHY MATERIAL FOR IMMERSION LITHOGRAPHY PROCESSES

(75) Inventor: Ching-Yu Chang, Yuansan Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 211 days.

(21) Appl. No.: 12/913,191

(22) Filed: Oct. 27, 2010

(65) Prior Publication Data

US 2012/0034558 A1 Feb. 9, 2012

Related U.S. Application Data

(60) Provisional application No. 61/370,332, filed on Aug. 3, 2010.

(51) Int. Cl.
*G03F 7/004* (2006.01)
*G03F 7/20* (2006.01)
*G03F 7/40* (2006.01)

(52) U.S. Cl.
USPC ............ 430/270.1; 430/273.1; 430/913; 430/396; 430/330; 430/331

(58) Field of Classification Search
USPC .................................... 430/270.1, 913
See application file for complete search history.

(56) References Cited

U.S. PATENT DOCUMENTS

| | | | | |
|---|---|---|---|---|
| 7,368,220 B2 * | 5/2008 | Kanda et al. | | 430/270.1 |
| 7,611,820 B2 * | 11/2009 | Kanda et al. | | 430/270.1 |
| 7,635,554 B2 * | 12/2009 | Fukuhara et al. | | 430/270.1 |
| 7,794,914 B2 * | 9/2010 | Ando et al. | | 430/270.1 |
| 7,998,655 B2 * | 8/2011 | Tsubaki | | 430/270.1 |
| 8,080,363 B2 * | 12/2011 | Kanda | | 430/270.1 |
| 2007/0031760 A1 | 2/2007 | Chang et al. | | |
| 2007/0077516 A1 | 4/2007 | Chang | | |
| 2007/0077517 A1 | 4/2007 | Chang | | |
| 2007/0134588 A1 * | 6/2007 | Kanda et al. | | 430/270.1 |
| 2008/0030692 A1 | 2/2008 | Wang et al. | | |
| 2008/0076038 A1 | 3/2008 | Chang et al. | | |
| 2009/0239176 A1 * | 9/2009 | Kanda | | 430/285.1 |

OTHER PUBLICATIONS

Ching-Yu Chang; "Photolithography Material for Immersion Lithography Processes;" Filed Aug. 16, 2010; U.S. Appl. No. 61/370,332.
Naomichi Abe, Satoshi Takechi, Yoko Kaimoto, Makoto Takahashi and Koji Nozaki; "Study of ArF Resist Material in Terms of Transparency and Dry Etch Resistance;" 1995; pp. 637-642; vol. 8, No. 4; Journal of Photopolymer Science and Technology; The Technical Association of Photopolymers, Japan.
Robert D. Allen, Phillip J. Brock, Linda Sundberg, Carl E. Larson, Gregory M. Wallraff, William D. Hinsberg, Jeff Meute, Tsutomu Shimokawa, Takashi Chiba and Mark Slezak; "Design of Protective Topcoats for Immersion Lithography;" 2005; pp. 615-619; vol. 18; No. 5; Journal of Photopolymer Science and Technology.

* cited by examiner

*Primary Examiner* — Amanda C. Walke
(74) *Attorney, Agent, or Firm* — Haynes and Boone, LLP

(57) ABSTRACT

A photolithography material is provided. The photolithography material is a surface modifying material. The photolithography material includes a polymer (e.g., fluorine polymer) that includes less than approximately 80% hydroxyl groups. In an embodiment, the photolithography material includes less than approximately 80% fluoro-alcohol functional units. Methods of using the photolithography material include as an additive to a photoresist or topcoat layer. The photolithography material may be used in an immersion lithography process.

9 Claims, 5 Drawing Sheets

PHOTOLITHOGRAPHY MATERIAL FOR IMMERSION LITHOGRAPHY PROCESSES

CROSS REFERENCE

The present application claims priority to U.S. Provisional Application Ser. No. 61/370,332, filed on Aug. 3, 2010, the disclosure of which is incorporated herein by reference in its entirety.

BACKGROUND

The present disclosure relates generally to materials that can be used in photolithography processes such as immersion lithography. However, other applications may benefit from aspects of the disclosure and be within the scope of the disclosure.

Lithography is a mechanism by which a pattern on a mask is projected onto a substrate such as a semiconductor wafer. As feature sizes decrease, immersion lithography, in which the exposure procedure is performed with a liquid filling the space between the wafer and the lens, is often used. Using immersion lithography allows for higher numerical apertures (NA) than when using lenses in air, and therefore, provides for improved resolution. Further, immersion provides enhanced depth-of-focus (DOF) for printing smaller features.

Immersion lithography may use water or other suitable immersion exposure fluid in the space between the wafer and the lens. The immersion fluid can cause issues such as, droplets of fluid interfering with the exposure process. For example, at a high scanning speed, an immersion fluid drop and/or a resulting "bubble" may impact the image performance. The immersion fluid drop may also induce particles to the wafer surface. Furthermore, the immersion fluid drop may influence the photosensitive material chemical distribution in a resist layer, which may decrease the image pattern performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting.

Furthermore, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Additionally, reference numbers are repeated throughout the drawings for sake of convenience and example, and such repetition does not indicate any required combination of features or steps throughout the drawings.

Immersion Lithography

Figure 1:
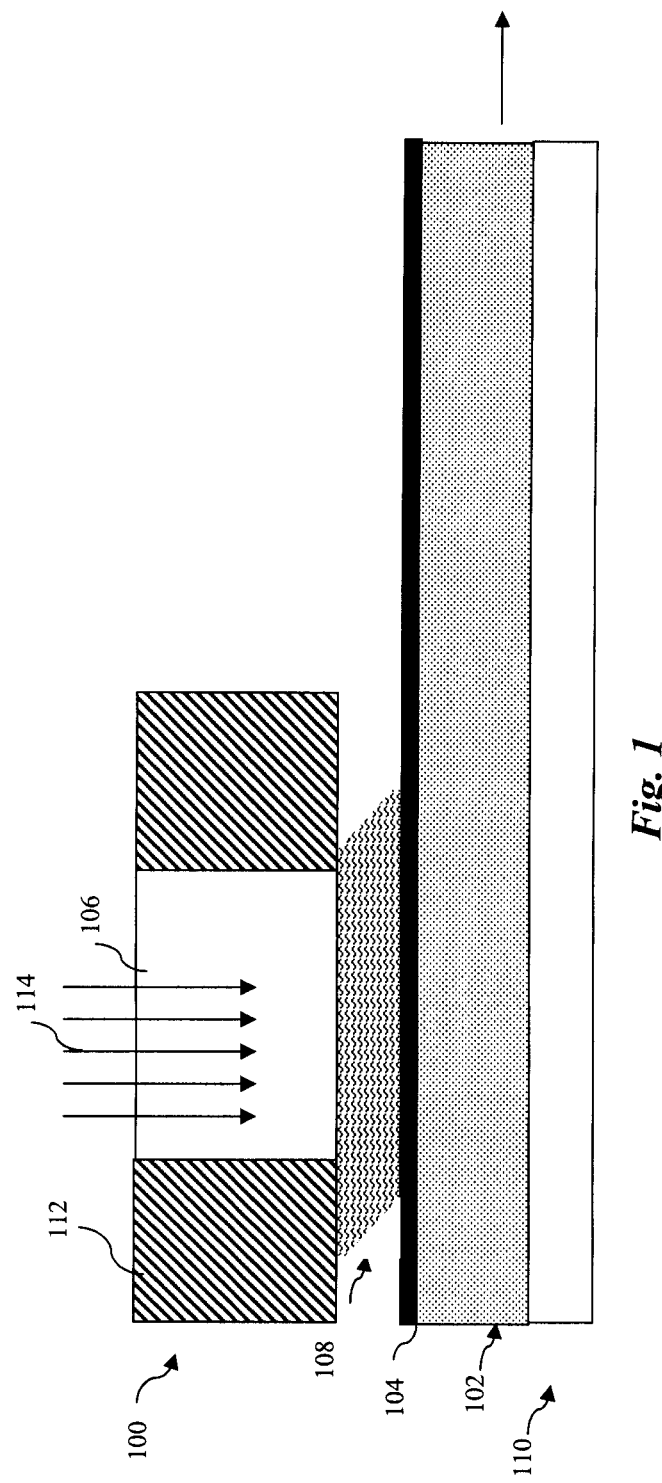
FIG. 1 is a cross-sectional view of an embodiment of an immersion lithography system.

Illustrated in FIG. 1 is an immersion lithography system or tool (e.g., scanner). The immersion lithography system 100 provides for patterning a resist layer 104 of a substrate (e.g., wafer) 102. The immersion lithography system 100 includes a lens system 106 in an immersion hood 112, which may provide for containing a fluid 108, and a wafer stage 110. The wafer 102 is positioned on the wafer stage 110, which is operable to move the wafer 102 relative to the immersion hood 112. Radiation 114 may be an ultraviolet light source, for example deep ultra-violet: a krypton fluoride (KrF, 248 nm), argon fluoride (ArF, 193 nm), F2 (157 nm), and extreme ultra-violet (EUV, 13.5 nm). The fluid 108 may be de-ionized water, carbonic acid water, and/or other suitable immersion fluid that provides an improved reflective index relative to air. In an embodiment, the fluid 108 contacts the resist 104 at an area covering greater than the image field. For example, a single die may be imaged, but the fluid 108 may cover approximately 3 die in area. In the illustrated system, the wafer stage 110 is moving the substrate 102 to the right, exposing across the wafer 102.

Figure 2:
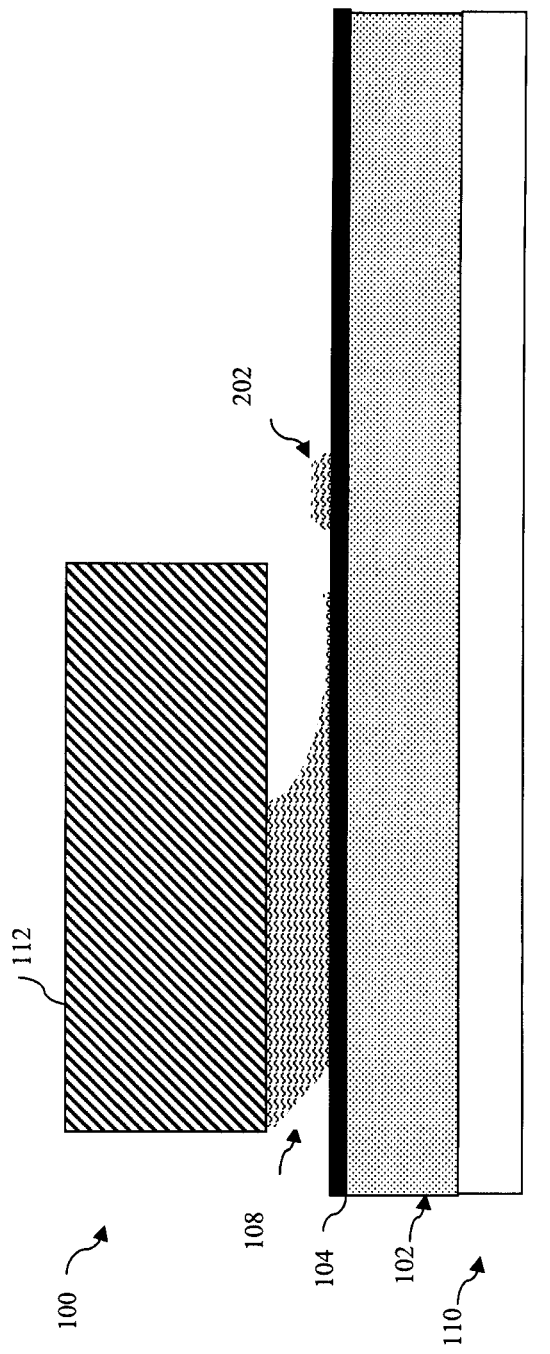
FIG. 2 is a cross-sectional view of a further embodiment of the immersion lithography system.

Immersion lithography may use many of the same attributes as conventional (e.g., dry) exposure, except that an immersion fluid (e.g., water) 108 is between the lens 106 and the wafer 102. The immersion fluid 108 improves the optical resolution. However, it also introduces additional issues. For example, chemicals may leach from the resist 104, which may impact the fidelity of the patterning and the lens system 106. As a further example, if a photo-acid generator (PAG) is leaching from the resist 104, the critical dimension (CD) would decrease. If the immersion fluid 108 (e.g., water) is absorbed by the resist 104, the CD would increase because of larger acid diffusion. Additionally, there may be a droplet 202 of immersion fluid remaining after exposure, as illustrated in FIG. 2. The droplet 202 may accumulate impurities (e.g., PAG or quencher leaching from the resist 104), which could impact the pattern on the resist 104. For example, enlarging or reducing the CD. Droplet 202 may be a contaminate resource for immersion defects. If the droplet 202 contains particles of impurities, the particles may adhere to the resist surface after the droplet 202 dries. A top scum pattern may form to become a blind hole defect or scum line pattern defect if the droplet contain quencher or other base impurity. In another case, the droplet 202 may cause a bubble to impact the exposure light 114 transmitting through liquid 108 when a second exposure (e.g., immersion fluid) contacts the water drop.

High Hydroxyl Functional Group Materials

Many of these above mentioned issues can be controlled in whole or in part by the use of a top coat layer (or isolation layer) that isolates the resist 104 from the immersion fluid 108. Alternatively, topcoat-less (or topcoat-free) photoresists may be used that isolate or reduce the resist 104 impact from the immersion fluid 108. Topcoat-less photoresists use an additive (e.g., a fluorine containing polymer) provided in the conventional resist. The additive can diffuse to the resist surface region to function as a top coat or isolation layer. The additive (e.g., fluorine polymer) and/or separately applied topcoat layer can provide an isolation region that prevents water penetration to the underlying photoresist and/or prevent chemical leaching from the resist.

Topcoat layers and topcoat-less photoresists may contain a fluorine containing polymer. These polymers result in the materials containing a high quantity (absolute or relative) of hydroxyl (—OH) functional groups. These hydroxyl groups cause the surface of the topcoat or topcoat-less photoresist to absorb portions of the immersion fluid when in contact with the fluid. In particular, the hydroxyl groups may allow for molecular water (e.g, from the immersion fluid) to be easily absorbed and/or to form a thin film of water on the surface of the topcoats and topcoat-less photoresists by hydrogen bonding with the hydroxyl groups.

The hydroxyl groups have been used however, for example, in the fluorine polymer of the topcoat-less photoresist, to increase the solubility of the fluorine polymer with the resist polymer. In order to properly form a topcoat-less photoresist, prior to application on a wafer, the fluorine polymer additive should have a sufficient mixing ability with the polymer of the photoresist. The hydroxyl groups also benefit in allowing for solubility to the developer (e.g., tetramethylammonium hydroxide (TMAH)). One example of a hydroxyl group is a fluoro-alcohol (RfOH) such as RC(CF3)2OH or RCF2OH. The fluoro-alcohol has a high solubility to developer (e.g., changed from RCF2OH to RCF2O— on contact with developer). As another example of a need met by the hydroxyl groups, they provide solubility to solvents typically used in topcoat layers (e.g., alcohol solvents such as iso-butanol or iso-propanol). It is noted that the solvent of a topcoat layer are different from those of the photoresist as to prevent the topcoat layer dissolving into the resist. Furthermore, fluorine has inert characteristics which provide a low tendency to interact with other polymers, the hydroxyl group is added to provide a polarity.

However, as described above, immersion fluid droplets may be produced from lithography processes. A surface having a high occurrence hydroxyl functional groups may cause and/or exacerbate this issue. Droplet frequency is especially a concern at high scan speeds (e.g., 600-850 mm/sec) of the lithography system (e.g., scanner). Therefore, what is needed is a photolithography material that provides a surface region that provides for reduced hydrogen bonding with an immersion fluid.

Surface Modifying Material

On recognizing the issues of immersion lithography and the composition of the surface of the target substrate, the disclosure provides a surface modifying material, which modifies the interaction between the target substrate and the immersion fluid. The surface modifying material may be a distinct layer which is separately formed, or an additive to a material typically used in photolithography. For example, the surface modifying material may be an additive mixed with conventional photoresist, topcoat-less photoresist, a topcoat material, and/or other material used in immersion lithography. Several of these embodiments are described below with reference to FIGS. 4, 5, 6, and 7.

The surface modifying material reduces the quantity of hydroxyl functional groups present at a surface region of the substrate, which may be in contact with an immersion fluid. In an embodiment, the surface modifying material provides a surface region having a reduced quantity of hydroxyl functional groups, for example, less than approximately 60 percent. For example, the fluoroalcohol (RfOH) groups may be reduced to less than 80%. (It is noted that Rf is alkyl fluoride).

In another embodiment, the total quantity of hydroxyl (—OH) groups may be reduced to less than approximately 80%. For example, the total quantity of —OH groups may be determined from the sum of the ROH, RCOOH, and RfOH functional groups. In an embodiment, the surface modifying material provides a region having reduced quantity of hydroxyl functional groups of less than approximately 80 percent. For example, the fluoroalcohol (RfOH) groups may be reduced to less than 80%. In another embodiment, the total quantity of —OH groups may be reduced to less than approximately 80%. For example, the total quantity of —OH groups may be determined from the sum of the ROH, RCOOH, and RfOH functional groups.

Figure 3:
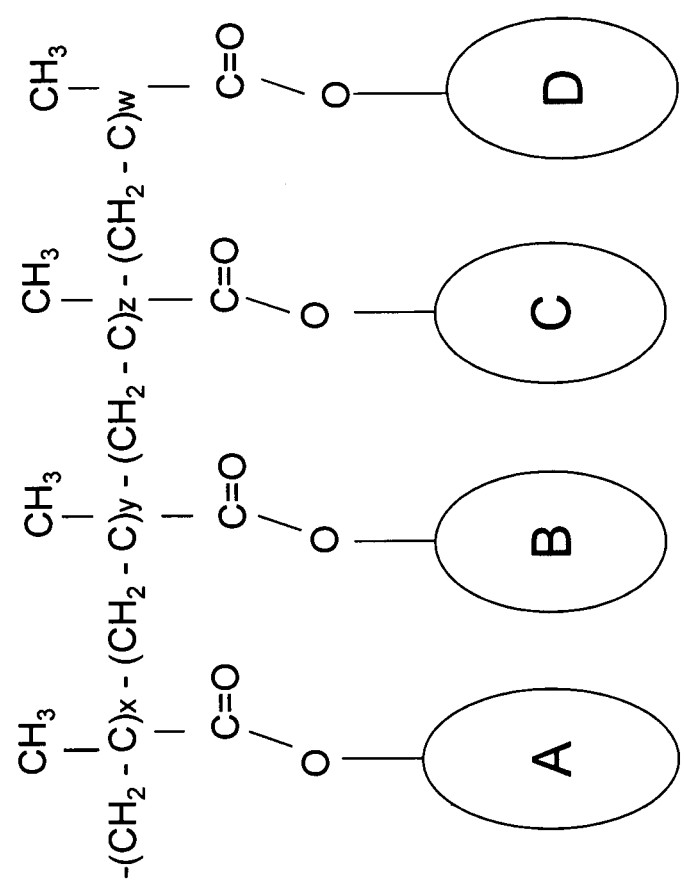
FIG. 3 is a chemical diagram of a polymer material for use in one or more embodiments of the present disclosure.

Referring now to FIG. 3, illustrated is a structure of an embodiment of a surface modifying material. (Again it is noted that the surface modifying material may be a distinct material or an additive to one or more other materials typically used in photolithography). The illustrated embodiment shows four (A,B,C,D) distinct components or polymer units of the polymer structure. In other embodiments, one, two, or three polymer units may be used. These polymer units are described in greater detail below.

The surface modifying material may include one or more functional groups that provide for reduced hydrogen bonding with immersion liquid and/or reduced hydroxyl content of the material itself Possible functional groups which may provide for decreased hydroxyl groups and/or less affinity (bonding) to fluid include, but are not limited to, R, H, ROH, R1COOR2, R1COR2, R, Rf, R1OR2, R1COOR2COORf, R1COOR2NH2COOR3, RCOORf, and/or R1COO(CH$_2$)xNHCOONHR2. Any one of these functional groups may be included as a polymer unit (e.g, A) of the polymer of FIG. 3. (Attributes of one or more of these groups is discussed below). R designates a saturated alkyl group $C_nH_{2n+1}$, branch alkyl group, or cyclic alkyl group, wherein the alkyl group may contain a hetero atom. The hetero atom may contain oxygen, nitrogen, or sulfide. Rf designates a fluoroalkane group $C_nF_{2n+1}$ or a fluoro containing alkyl group $C_nH_mF_n$, where the m+n=2n+1 or a fluorine contain alkyl structure, where the fluorine contain alkyl struture can be straight, branch, or cyclic. The fluorine containing polymer may further include a hetero atom; the hetero atom may contain oxygen, nitrogen, or sulfide.

The strength of water absorbance from highest strength to lowest strength may be considered in determining a specific formulation of the surface modifying material. For example, in terms of strength of bonding to water: RfO—>RfOH>ROH>R1COOR2>R1OR2>R>Rf. Therefore, in one embodiment, the determination of the structure for the surface modifying material may be to increase the number of lower strength groups. In one embodiment, the determination of the structure for the surface modifying material replaces functional groups of a topcoat material and/or of the fluorine polymer of topcoat-less resist. These functional groups, which may include functional groups with a greater affinity to water (highest bonding) such as RfO— and RfOH, may be replaced with those having the lowest strength. For example, functional groups of a conventional topcoat or topcoat-less photoresist may be replaced with the above described functional groups to provide a novel surface modifying material.

In an embodiment, the surface modifying material has decreased affinity for hydrogen bonding with an immersion fluid as it includes functional groups or polymer units that do not have a terminal hydroxyl group. For example, a RCOORf polymer may be used in the surface modifying material. In an embodiment, RCOORf is included in polymer group A, or in at least one of the polymer groups A, B, C, and/or D.

In an embodiment, the surface modifying material has a decreased affinity for hydrogen bonding with an immersion fluid as it includes functional groups or polymer units that do not have a terminal hydroxyl group. For example, the R polymer may be used in the surface modifying material. In an embodiment, R is included in polymer group A, or in at least one of the polymer groups A, B, C, and/or D. The R group may compose of conventional acid labile function group. For example, the R group may methyl-adamantyl group, ethyl-adamantyl group, isopropyl-adamantyl group, methyl-cyclopentyl group, ethyl-cyclopentyl group, and/or isopropyl-adamantyl group. The acid labile polymer may further include a treatment process. For example, the acid labile polymer may be treated with acid and a thermal heating process to turn on the chemical amplify reaction. After the heating process, the acid labile group is partially ionized. The ionized acid labile group becomes a leaving group after contacting a developer (e.g., TMAH). The treated acid can be a photosensitive acid, for example, it may compose of photo acid generator (PAG). Alternatively, it may be a non-photosensitive acid, for example, it may include HCL, H2SO4, HNO3, HCOOH, or CH3COOH. Before the developing process, the R group is hydrophobic—with a good resistance to water isolation. After contact with the developer, the R group is leaving/removed and the surface modifying material becomes very hydrophilic and has a good solubility to the developer (e.g., TMAH) and water.

For additive approach to a surface modifying material, the additive surface modifying material is added into resist. A fluorine containing structure is designed for floating control. One option for polymer unit B,C, and/or D is a compound of fluorine containing unit. The fluorine unit may include one of the functional group selected from a group consisting of RfOH, Rf, RCOORCOORf, RfCOOR, RCOORfCOOR, and RCOORf. The alkyl or alky fluoride may have a straight, branched, of cyclic structure. The fluorine containing unit should be larger than 10% of the total surface modifying material functional unit.

In an embodiment, polymer unit A is a functional group with less than approximately 80% fluoro-alcohol functional groups (e.g., RFOH, RfO—). In an embodiment, polymer unit A is a functional group with less than approximately 60% hydroxyl functional groups (e.g., RfOH, ROH). One or more of the polymer units B, C, and D may be selected from the following options (which are illustrative and not limiting).

One option for the polymer unit B, C, and/or D is a compound of —R1-COO—R2, where R1 and R2 are alkyl groups. R1 for example may be a benzene, nitrogen, oxygen, or fluorine containing alkyl group. R1 may have a straight, branched, or cyclic structure. R2 may be a fluorine containing alkyl, amine containing alkyl, lactone, nitrogen containing alkyl, oxygen containing alkyl, or benzene containing alkyl. R2 may have a straight, branched, of cyclic structure. R1 and/or R2 may be decomposed by a developer solution (e.g., TMAH). Thus, the compound of —R1-COO—R2 may improve the solubility of the surface modifying material with a solvent and/or polymer. Moreover, after the R1 and/or R2 group is decomposed by a developer solution, the surface modifying material has an improved solubility to developer and water.

Another option for the polymer unit B, C, and/or D is lactone (a cyclic ester). The lactone may be directly attached to a polymer ester group. The lactone structure may increase the polarity of the surface modifying material and/or increase its solubility to a developer. This may allow for proper control of the contact angle during the lithography process and/or improve solubility with resist.

Yet another option for the polymer unit B, C, and/or D is an acid labile group (ALG). The ALG component may provide a photosensitive structure. The ALG component may increase the surface modifying material's affinity to photoresist, provide solubility in a developer solution, and/or provide a hydrophobic surface to reduce interactions with the immersion fluid.

Yet another option for the polymer unit B, C, and/or D is a hydroxyl group (—ROH). The R (alky) group may be a straight, branch, or cyclic organic structure. The —ROH group may provide solubility with a polymer. (It is noted that —ROH has a decreased affinity to water than that of RfOH). R for example may be a benzene, nitrogen, oxygen, fluorine, lactone containing alkyl group, amine containing alkyl structure.

Yet another option for the polymer unit B, C, and/or D is a H group. The H component may increase the surface modifying material's affinity to photoresist and/or provide solubility in a developer solution.

In reducing the hydroxyl groups of the polymer material of the surface modifying material (e.g., to less than 80%), one or more of the attributes discussed above with respect to high hydroxyl group material must be considered. Any one of the following discussed functional groups may be used to provide a surface modifying material having a decreased hydroxyl functional groups (e.g., <80%). Referring to FIG. 3, any one of the following discussed functional groups may be included in the component as polymer group A (or B, C, or D).

For example, the present disclosure recognizes that hydroxyl groups increase the solubility of a fluorine polymer to solvent and/or polymer (e.g., of resist or top coat). By reducing the hydroxyl group, the solubility can be impacted. However, by introducing low polarity groups such as, for example, ROH, R1COOR2, and/or R1OR2 (e.g., as opposed to RfOH), the solubility to the solvent of the resist and/or topcoat material can be sufficiently maintained. It may be advantageous to provide solubility of the surface modifying material with photoresist (or topcoat) such that the solution won't separate prior to application (e.g., spin on coating) onto the substrate.

As another example, the reduced hydroxyl groups (e.g., reduced RfOH) of the surface modifying material may impact the contact angle (CA) switchability after developer is applied. For example, RfOH has a high solubility to TMAH and becomes RfO— on contact; the contact angle is also decreased (e.g., from 60 to 50 degrees). By introducing a new functional group, for example, R1COOR2COORf, the contact angle switching function may be maintained and hydroxyl groups reduced. On contact with developer R1COOR2COORf will be changed to R1COOR2COO−. (The group RCOORCOORf may replace an RfOH group in conventional resist/topcoat materials). In another embodiment, R1COOR2NHCOOR3 may be used. R1COOR2NHCOOR3, after contact with developer (e.g., TMAH), becomes R1COOR2NH3+. Thus providing the property of switching the contact angle from non ionic R1COOR2NH2COOR3 to ionic R1COOR2NH3+. R1 and R2 may have a straight, branched, or cyclic structure. It may also be a fluorine containing alkyl, amine containing alkyl, lactone, nitrogen containing alkyl, oxygen containing alkyl, or benzene containing alkyl.

As another example, the reduced hydroxyl groups (e.g., RfOH) of the surface modifying material may impact the solubility of the surface modifying material to the developer applied. For a topcoat layer, the topcoat layer should be totally removed when contacted with developer, such that the underlying resist can be appropriately patterned. For topcoat-less photoresist (e.g., a resist having a fluorine polymer additive), the fluorine polymer additive needs to be soluble in developer. If the polymer is insoluble, it may become a defect. By introducing a cleavable fluorine polymer such as RCOORRCO-ORf, the solubility to the developer may be maintained in the surface modifying material. Groups such as RCOORRCO-ORf have a low terminal hydroxyl group, but are able to keep a switching function for solubility during developer process and surface CA control during immersion process. Another example which may maintain the solubility of the surface modifying material to developer is lactone or a TMAH cleavable functional group, for example, a structure including R1COO(CH2)xNHCOONHR2. R1COO(CH2)xNHCOONHR2 is cleavable by TMAH and becomes R1COO(CH2)xNH2, which improves solubility.

Applications of Surface Modifying Material

The composition of the surface modifying material is discussed in detail above. For example, the surface modifying material is a polymer substance that has less than approximately 60% hydroxyl functional groups. In lieu of hydroxyl functional groups, possible functional groups which may provide for decreased hydroxyl content and/or less affinity (bonding) to fluid include, but are not limited to ROH, R1COOR2, R1COR2, R, Rf, R1OR2, RCOORCOORf, R1COOR2NH$_2$COOR3, RCOORf, and/or R1COO(CH$_2$)xNHCOONHR2. The surface modifying material may be formed as a separate layer, and/or used as an additive in one or more materials typically used in the photolithography process. FIGS. 4, 5, 6, and 7 refer to exemplary embodiments of devices including surface modifying material.

Figure 4:
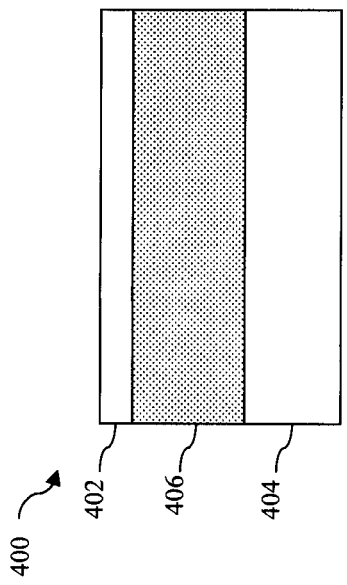

FIG. 4 illustrates an embodiment of a surface modifying material layer 402 being disposed on the substrate 404 of a device 400. In one embodiment, the substrate 404 includes silicon, but other embodiments may include Ge, SiGe, GaAs, and so forth. The substrate 404 may alternatively include a non-semiconductor material such as a glass plate for thin-film-transistor liquid crystal display (TFT-LCD) devices, a substrate for a photomask (e.g., quartz), material suitable to provide substrates for devices such as microelectromechanical (MEMS) devices (e.g., glass/quartz), and/or other suitable substrate. The substrate 404 further includes one or more material layers to be patterned.

One or more layers are disposed between the surface modifying material layer 402 and the substrate 404 including a resist 406. The resist layer 406 may be a standard resist which includes a polymer material that turns soluble to a developer such as a base solution when the polymer is reacted with acid. The resist layer 406 further includes a solvent. The solvent may be partially evaporated due to baking processes. The photoresist 406 may include a photo acid generator (PAG) to produce the acid, thereby supporting a chemical amplified reaction (CAR). During the lithography process, a photon induces decomposition of the PAG and forms a small amount of acid. The formed acid induces a cascade of chemical transformations in the resist (e.g., during a post-exposure bake). It is understood that there are many other types of resist, including those with photo base generator (PBG). Both positive and negative resists are within the scope of the present disclosure.

In an embodiment, the surface modifying material layer 402 is formed on the substrate 404 using a separate and distinct process (e.g., spin-on coating), subsequent to the formation of the resist 406. In the embodiment, the surface modifying material layer 402 acts as a top layer which interfaces with the immersion fluid. The surface modifying layer 402 may include any one of the compositions discussed above. For example, in an embodiment the surface modifying layer 402 includes less than approximately 80% hydroxyl groups. In an embodiment, the surface modifying layer 402 directly interfaces with the resist 406. In this embodiment, the solvent of the surface modifying layer 402 may include an alcohol solvent to avoid intermixing with resist during the coating process for the surface modifying layer 402.

Figure 5:
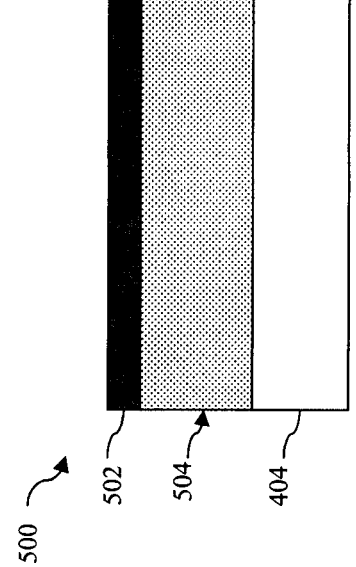
FIGS. 4, 5, 6, and 7 are cross sectional views of a semiconductor substrate having a surface modifying material.

FIG. 5 illustrates an embodiment of a surface modifying material layer 502 being disposed on the substrate 404 of a device 500. The surface modifying material layer 502 is formed as a portion of the photoresist layer 504. The surface modifying material is provided as an additive in standard resist, such as described above as resist 406 in FIG. 4. The surface modifying material, after application to the substrate, may diffuse to the surface of the photoresist. Thus, the surface modifying material form an upper portion of the photoresist layer (502), with the resist below it. This is illustrated as the surface modifying layer 502 and the photoresist layer 504. The resist with surface modifying additive may be applied to the substrate 404 using a spin-on coating process. Movement to the upper surface may be caused by molecular weight differences, polarity differences, solubility differences, affinity to the solvent, and/or other mechanisms. In the embodiment of FIG. 5, the surface modifying material layer 502 acts as a top layer (e.g., portion) which interfaces with the immersion fluid. The surface modifying layer 502 may include any one of the compositions discussed above. For example, in an embodiment the surface modifying layer 502 includes less than 80% hydroxyl groups.

Figure 6:
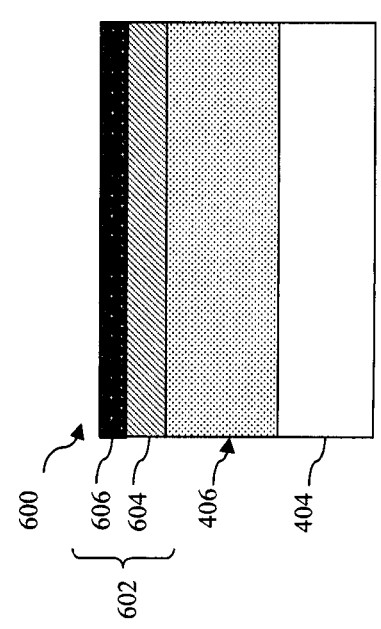

Referring now to FIG. 6, illustrated is a device 600 which includes a substrate 404 having a resist layer 406 and a modified topcoat layer 602. The modified topcoat layer 602 includes two portions (e.g., layers): a high RfOH group top coat layer 604 and a surface modifying additive layer 606.

The high RfOH group top coat layer 604 may be a high fluorine polymer material includes a high hydroxyl ratio material (e.g., high RfOH) as discussed above. The high RfOH group top coat layer 604 may prevent water uptake in the resist 406. In an embodiment, high RfOH group top coat layer 604 includes greater than 80% fluoroalcohol. In an embodiment, high RfOH group top coat layer 604 includes approximately 85% fluoroalcohol. The high RfOH group top coat layer 604 may provide a barrier for water absorption into the underlying resist 504.

The surface modifying additive layer 606 comprises a surface modifying material, as discussed above. The surface modifying additive layer 606 includes a less than 80% hydroxyl ratio material, as also discussed above. The surface modifying additive layer 606 may be formed by providing a polymer additive having a low hydroxyl functional group ratio into the material of the high RfOH group top coat layer 604. The top coat layer 604 may include a topcoat material known in the art. Movement to the upper surface (e.g., separation of 604/606) may be caused by molecular weight differences, polarity differences, solubility differences, affinity to solvent, and/or other mechanisms. For example, the high RfOH group top coat layer 604 material may diffuse below the surface modifying additive layer 606 material because of the affinity to the resist polymer. In particular, the RfOH groups of the high RfOH group top coat layer 604 may have an affinity with the resist polymer of the resist 406. Thus, FIG. 6 provides an exemplary application of the described surface modifying material of use as an additive in a topcoat layer.

Figure 7:
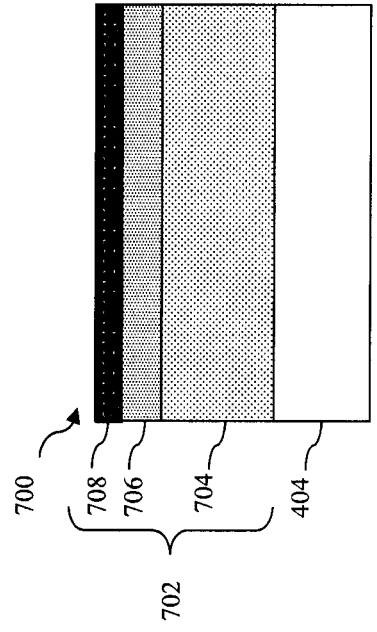

Referring now to FIG. 7, illustrated is a device 700 which includes a substrate 404 and a photolithography material layer 702. The layer 702 includes three portions (e.g., layers). The first layer is a photoresist 704. The photoresist 704 is a standard resist composition such as described above with reference to resist 406 in FIG. 4. The second portion (layer) is a first additive layer 706. The first additive layer 706 is a high fluorine polymer material. The first additive layer 706 may include a high hydroxyl ratio material (e.g., high RfOH) as discussed above. The first additive layer 706 that contains a high fluorine polymer material may prevent water uptake in the resist 704. In an embodiment, the first additive layer 706 includes greater than 80% fluoroalcohol. In an embodiment, the first additive layer 706 includes approximately 85% fluoroalcohol. The first additive layer 706 may be formed by providing a fluorine polymer additive to a conventional resist (e.g., making topcoat-less resist). The fluorine polymer then diffuses to the resist surface after coating on the substrate creating first additive layer 706.

The third portion (layer) is a second additive layer 708. The second additive layer 708 is a surface modifying material substantially similar to as described above (see, e.g., FIG. 3 and accompanying description). The second additive layer 708 includes less than approximately 80% hydroxyl ratio material. The second additive layer 708 may minimize affinity to (e.g., hydrogen bonding with) an immersion fluid. The second additive layer 708 may be formed by providing an additive of a polymer having a low hydroxyl functional group ratio into a conventional resist (and/or a conventional resist plus additional additives such as those of the first additive layer 706). Movement to the upper surface may be caused by molecular weight differences, polarity differences, solubility differences, affinity to solvent, and/or other mechanisms. The first additive layer 706 may diffuse below the second additive layer 708 because of the first additive layer 706 affinity with the resist polymer of the resist 704. In particular, the RfOH groups of the first additive layer 706 may have an affinity with the resist polymer of the resist 704.

The first additive layer 706 and the second additive layer 708 may provide a photolithography material layer 702 composition having at least 1% fluorine polymer.

Thus, FIG. 7 provides an exemplary application of the described surface modifying material of use as an additive in a photoresist that also has a polymer additive (e.g., high fluorine polymer) to prevent water uptake. The surface modifying material additive may be provided in a topcoat-less resist (e.g., a resist that includes an additional additive of a fluoro-polymer with high RfOH).

Thus, FIGS. 4, 5, 6, and 7 illustrate devices that have a surface region of a substrate that has a lower affinity to immersion fluid. In an embodiment, this may provide for reduced droplets of immersion fluid present on the substrate. The surface region of FIGS. 4, 5, 6, and 7 have decreased hydroxyl group (e.g, fluoro-alcohol). In an embodiment, the surface regions have less than approximately 80% hydroxyl groups.

The Lithography Process

Figure 8:
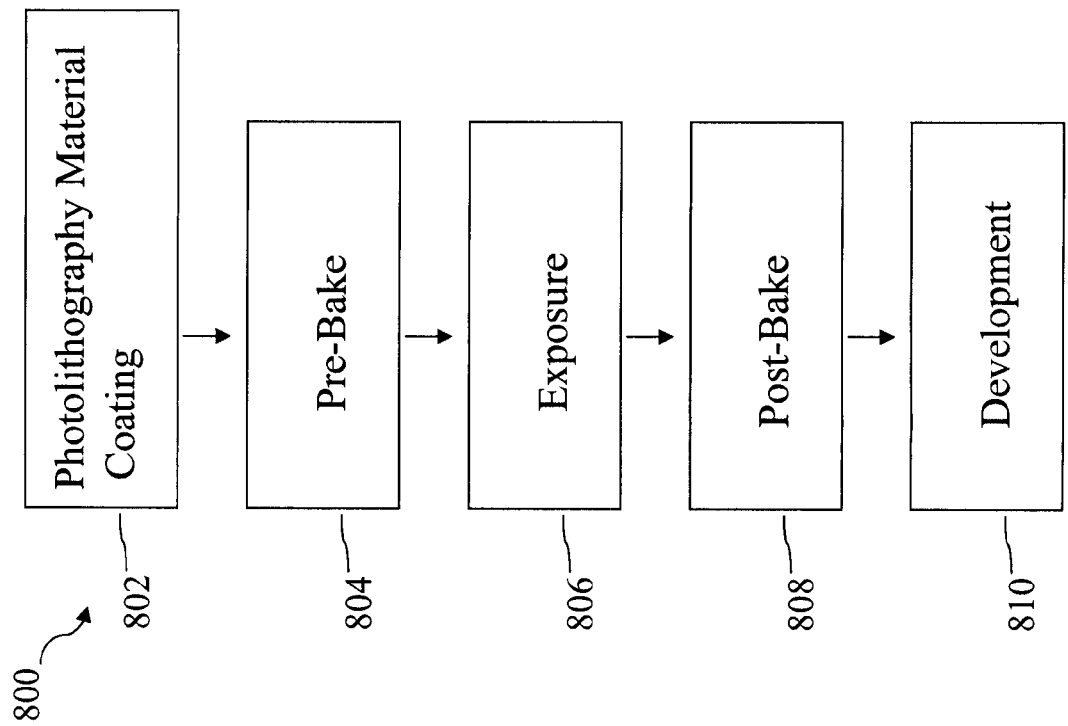
FIG. 8 is a flow chart illustrating an embodiment of an immersion lithography process.

Referring to FIG. 8, a simplified flowchart of a method for lithography 800. The lithography method 800 is but one example of a process that can benefit from one or more embodiments of the present invention. In furtherance of the present example, the lithography method 800 will be described as an immersion lithography process.

Referring to FIG. 8, the immersion lithography method 800 begins at block 802, where the substrate (e.g., wafer) is coated with one or more layers of photolithography materials. The application of the photolithography material may be done with spin-coating or another suitable procedure.

In an embodiment, the photolithography materials deposited include a typical negative or positive type photoresist. The photoresist may be substantially similar to the resist 406, described above with reference to FIG. 4. In an alternative embodiment, the photolithography materials include a photoresist with one or more additives, e.g., a high hydroxyl group additive (e.g., high RfOH) and/or a low hydroxyl group additive, as described above as a surface modifying material.

In an embodiment, after application of a photoresist layer, a layer having a fluoro-polymer structure with high RfOH groups is coated. The layer may be referred to as a topcoat layer. The layer may serve to prevent water uptake by the underlying resist. The topcoat layer may further include an additive having a low hydroxyl group, described above as a surface modifying material.

In an embodiment, after application of one or more photolithography materials (e.g., resist and top coat layer) an additional coating layer may be formed. The additional coating layer may be a surface modifying material layer, as described above.

Thus, in the block 802, lithography materials may be formed where one or more of the materials includes an additive of a surface modifying material or a distinct layer of the surface modifying material is formed. Thus, formed is a stack of photolithography material layers wherein the top layer is a surface modifying material. The surface modifying material provides a decreased hydroxyl functional group region (e.g., less than approximately 80%) at the surface region. This reduces the bonding with the immersion fluid. As described above, exemplary functional groups included in the surface modifying material polymer include ROH, R1COOR2, R1COR2, R, Rf, R1OR2, RCOORCOORf, R1COOR2NH$_2$, COOR3, RCOORf, and/or R1COO(CH$_2$)xNHCOONHR2.

The immersion lithography method 800 then proceeds to block 804, where a pre-bake process is performed. The pre-bake process may assist in diffusing one or more additives of the photosensitive material and/or other lithography material layers.

The immersion lithography method 800 proceeds to block 806, where an immersion lithography exposure is performed. A substrate, including the photolithography materials (e.g., resist, topcoat (e.g., polymer with high quantity of RfOH), and/or surface modifying material layer) is immersed in an immersion exposure liquid (e.g., deionized water) and exposed to a radiation source through the lens. The radiation source may be an ultraviolet light source, for example deep ultra-violet: a krypton fluoride (KrF, 248 nm), argon fluoride (ArF, 193 nm), F2 (157 nm), and extreme ultra-violet (EUV, 13.5 nm). The resist is exposed to the radiation for a predetermined amount of time, dependent on the type of resist used, the intensity of the ultraviolet light source, and/or other factors. The exposure results in portions of the resist becoming soluble to a subsequent developer, while other portions remaining in a insoluble state. It is understood that a positive or negative resist can also be used, with inherent differences.

The immersion lithography method 800 proceeds to block 808, where the substrate with the exposed resist is heated with a post-exposure bake (PEB) for polymer dissolution. This step lets any generated photo acid (or base) react with the polymer and facilitate the polymer dissolution.

The immersion lithography method 800 proceeds to block 810, where a pattern developing process is performed on the exposed (positive) or unexposed (negative) resist to leave a desired mask pattern. The substrate is immersed in a developer liquid for a predetermined amount of time during which a portion of the resist is dissolved and removed. A separate, additional rinse may also be applied. The composition of the developer solution is dependent on the composition of the resist. A base solution of 2.38% tetramethyl ammonium hydroxide (TMAH) is one example of a developer solution. The development process may form a pattern in the resist which can be used as a masking element for further processing of the substrate, such as forming a semiconductor device feature or portion thereof. In an embodiment, in block 810 a topcoat layer (e.g, including a polymer with high RfOH composition) and/or a surface modifying material layer are removed by the developer solution.

In summary, the methods and devices disclosed herein provide for a surface region of a substrate that contacts the immersion fluid that has less affinity to bonding with an immersion fluid. In doing so, embodiments of the present disclosure offer advantages over prior art devices. Advantages of the present disclosure include reducing the number and frequency of droplets of immersion fluids. It is understood that different embodiments disclosed herein offer different disclosure, and that they may make various changes, substitutions and alterations herein without departing from the spirit and scope of the present disclosure.

Thus, in an embodiment the disclosure provides a photolithography material. The photolithography material includes a photoresist and an additive in the photoresist. The additive includes a fluorine polymer has less than approximately 80% fluoro-alcohol functional units.

Also provided is an embodiment of a method of performing photolithography. The method includes providing a substrate. A photolithography material layer is formed on the substrate. The photolithography material layer includes a first region having at least 1% fluorine polymer. The fluorine polymer has less than approximately 80% fluoro-alcohol polymer units at a surface of the photolithography material layer.

Further provided is another embodiment of a method of performing photolithography. The method includes providing a substrate and forming a photolithography material layer on the substrate. The photolithography material layer includes a first region having a photosensitive photoresist and a second region having a first fluorine polymer. The first polymer includes greater than approximately 80% fluoro-alcohol polymer units. The photolithography material layer further includes a third region having a second fluorine polymer. The second fluorine polymer includes less than approximately 80% fluoro-alcohol polymer units (e.g., is a surface modifying material, as described above.)

An embodiment of a photolithography material is also described that includes a photoresist, a first additive in the photoresist, and a second additive in the photoresist. The first additive includes a first polymer having less than approximately 80% fluoro-alcohol functional units. The second additive includes a second polymer having greater than approximately 60% fluoro-alcohol functional units.

Further still, an embodiment of a method of performing lithography is provided that includes forming a photoresist layer on a substrate. A topcoat layer is formed on the photoresist layer. The topcoat layer includes a first polymer having less than approximately 80% hydroxyl polymer units and a second polymer having greater than approximately 80% hydroxyl polymer units. The photoresist layer is then exposed to a pattern using immersion lithography.

What is claimed is:

1. A method of performing photolithography comprising:
   providing a substrate; and
   spin coating a photolithography material having a first additive and a second additive onto the substrate;
   forming a photolithography material layer of the photolithography material on the substrate by the spin coating, wherein the photolithography material layer includes:
      forming a first layer of photoresist;
      forming a second layer in the first layer including the second additive, and having a second fluorine polymer having frater than approximately 80% fluoro-alchohol polymer units; and
      forming a third layer in the second layer, wherein the third layer includes the first additive and has at least 1% of a first fluorine polymer, wherein the first fluorine polymer has less than approximately 80% fluoro-alcohol polymer units at a surface of the photolithography material layer; and
   treating the photolithography material layer with one of HCl, $H_2SO_4$, $HNO_3$, HCOOH, and $CH_2COOH$.

2. The method of claim 1, wherein the substrate is a semiconductor substrate.

3. The method of claim 1, wherein the first additive further includes a polymer unit selected from the group consisting of hydrogen, R1COOR2, an acid labile group, and a hydroxyl group, wherein each of R1 and R2include include an alkyl group.

4. The method of claim 1, further comprising:
   performing an immersion lithography process on the substrate, wherein an immersion fluid is in contact with the first region of the photolithography material layer.

5. The method of claim 1, wherein the second fluorine polymer includes at least one functional group selected from a group consisting of R, ROH, R1COOR2, R1COR2, Rf, R1OR2, RCOORCOORf, $R1COOR2NH_2COOR3$, RCOORf, and $R1COO(CH_2)nNHCOONHR2$; and wherein R1 and R2include alkyl groups and Rf include at least one of an fluoralkane and a fluoro containing alkyl group.

6. A method of providing a photolithography material, comprising:
   providing a photoresist,
   providing a first additive in the photoresist, wherein the first additive includes a first polymer having less than approximately 80 % fluoro-alcohol functional units and an acid labile group (ALG);
   providing a second additive in the photoresist, wherein the second additive includes a second polymer having greater than approximately 80 % fluoro-alcohol functional units; and
   applying a layer of the photoresist having the first and second additive to a substrate, wherein the applying includes floating the first additive to a first region of the layer and floating the second additive to a second region of the layer;
   treating the ALG with an acid and a thermal heating process, wherein the treating partially ionizes the ALG; and
   contacting the layer with a developer, wherein the ALG becomes a leaving group on contact with the developer.

7. The photolithography material of claim 6, wherein the first additive includes at RCOORf, wherein R includes an alkyl group and Rf includes at least of a fluoroalkane group and a fluoro containing alkyl group.

8. The method of claim 1, wherein the forming the second layer includes mixing the second additive with the photoresist prior to the spin coating, and wherein the second layer forms after the spin coating by diffusing to the surface of the first layer.

9. The method of claim 6, wherein the treating the ALG with the acid includes one of applying one of HCl, $H_2SO_4$, $HNO_3$, HCOOH, and $CH_2COOH$.

* * * * *